United States Patent [19]

Ikeda et al.

[11] Patent Number: 5,411,911
[45] Date of Patent: May 2, 1995

[54] PROCESS FOR PRODUCING DRAM SEMICONDUCTOR DEVICES

[75] Inventors: Norihiro Ikeda, Ogaki; Kaoru Taketa, Gifu, both of Japan

[73] Assignee: Sanyo Electric Co., Ltd., Osaka, Japan

[21] Appl. No.: 143,850

[22] Filed: Oct. 25, 1993

[30] Foreign Application Priority Data

Oct. 27, 1992 [JP] Japan .................................. 4-312842
Oct. 4, 1993 [JP] Japan .................................. 5-248095

[51] Int. Cl.$^6$ .............................................. H01L 21/70
[52] U.S. Cl. ........................................ 437/52; 437/47; 437/60; 437/919; 437/203
[58] Field of Search ................. 437/47, 48, 52, 60, 437/233, 203, 919; 257/303, 306; 156/643

[56] References Cited

U.S. PATENT DOCUMENTS

| | | | |
|---|---|---|---|
| 4,951,175 | 8/1990 | Kurosawa et al. | 437/52 |
| 5,026,659 | 6/1991 | Lee | 437/203 |
| 5,183,772 | 2/1993 | Jim et al. | 437/52 |
| 5,185,284 | 2/1993 | Motomami | 437/52 |
| 5,225,698 | 7/1993 | Kim et al. | 257/303 |

FOREIGN PATENT DOCUMENTS

2116160 4/1990 Japan .

*Primary Examiner*—Tom Thomas
*Attorney, Agent, or Firm*—Sheridan Ross & McIntosh

[57] ABSTRACT

A process for producing a semiconductor device comprises the following steps 1 to 9. In step 1, a field oxide layer is formed on a first conductivity type semiconductor substrate to define an active region. In step 2, gate electrodes, second conductivity type source regions and drain regions are formed on the active region, word line are formed on the field oxide layer, and an insulating layer is formed over the substrate. In step 3, contact holes are formed through the insulating layer so as to partly expose the source regions. In step 4, a polysilicon layer is formed over the exposed source region and the entire surface of the insulating layer. In step 5, a photoresist pattern is formed on the polysilicon layer. In step 6, the polysilicon layer is etched under etching conditions where selectivity to the insulating layer is high using the photoresist pattern as an etching mask to simultaneously form a storage pattern and trenches in the semiconductor substrate at the source regions. In step 7, the semiconductor substrate is doped along the storage electrode pattern and the inner surface of the trenches with a second conductivity type impurity. In step 8, a dielectric layer is formed on the doped storage electrode pattern and the doped inner wall surfaces of the trenches. Finally in step 9, an opposite electrode is formed on the dielectric layer.

16 Claims, 7 Drawing Sheets

PROCESS FOR PRODUCING DRAM SEMICONDUCTOR DEVICES

BACKGROUND OF THE INVENTION

1. Field of the Invention

This invention relates to a process for producing a semiconductor memory device, more particularly to a process for producing a DRAM (Dynamic Random Access Memory) employing a one-transistor type memory cell which provides both high integration and increased capacitance.

2. Description of the Related Art

Higher integration of semiconductor memory devices is desirable with the recent demand for semiconductor memory devices with larger capacities. The DRAM among other semiconductor memory devices has been concentrated on extensively as it is frequently a symbol of advancement in integration technology.

DRAM memory cells are grouped into one-transistor type, three-transistor type and four-transistor type cells, depending on the number of transistors used in the memory cell. The one-transistor type memory cell consists merely of one MOS capacitor for storing and thereby memorizing electric charge and one MOS transistor for transferring the electric charge. Accordingly, the construction of such a memory cell is simple and has a compact size compared with other types of memory cells. One-transistor type memory cells are generally employed in DRAMs of 4K bits or more.

Recently, evolution in DRAM technology has increased dramatically. 4M Bit and 16M Bit DRAMs are already commercially available, and 64M Bit and even 256M Bit DRAMs are now manufactured on experimental bases. One important thing in producing such large capacity DRAMs is to minimize chip size thereby reducing the size of the memory cells. One way to accomplish this is through higher integration which, in turn, achieves higher density memory cells. In order to attain this object, one-transistor type memory cells may be employed so as to reduce the size of the MOS capacitor. However, taking soft errors which must be avoided and noise margin which must be secured into consideration, it is preferable to increase capacitance of the capacitor. It is difficult to both reduce the volume and increase capacitance of a capacitor.

Capacitance C can be expressed by the following equation:

$$C = \epsilon_0 \epsilon_5 \cdot A/d \qquad (1)$$

where $\epsilon_0$ is permittivity in a vacuum; $\epsilon_5$ is the dielectric constant of dielectric medium (capacitor insulating layer) between the electrodes; A is the electrode area; and d is the thickness of the dielectric layer.

From the equation (1), the following methods can be given so as to increase capacitance while reducing the size of MOS capacitor:

(1) to increase the dielectric constant of the dielectric layer;
(2) to reduce the thickness of the dielectric layer; and
(3) to increase the electrode area by allowing the MOS capacitor to have a three-dimensional structure.

In the first method, it can be considered to use a dielectric layer having a high dielectric constant. However, such high dielectric layers are now under development and not in production. If the second method is used, as the size of the memory cell is reduced the thickness of the dielectric layer becomes extremely small and pinholes are readily formed therein. Thus, the second method is not practical from the standpoint of reliability. Under such circumstances, a combination of the second method and the third method is being studied, in which an MOS capacitor is allowed to have a three-dimensional structure to increase electrode area and the thickness of the dielectric layer is reduced as much as possible.

Referring to the structure of the one-transistor type memory cell, planar memory cells have widely been used. However, the area occupied by the memory cell increases in a planar memory cell as the electrode area is increased. Thus, it was attempted to increase the electrode area by allowing the MOS capacitor to have a three-dimensional structure, and stacked type memory cells and trenched type memory cells have been proposed.

The stacked type memory cell has a polysilicon multi-layered structure formed on a substrate. In producing such stacked type memory cells, the MOS capacitor is fabricated according to 3-layer polysilicon technology using a first polysilicon layer as a gate electrode (word line). This dielectric layer is disposed between a second polysilicon layer and a third polysilicon layer. Accordingly, the electrode area can be increased by increasing the film thickness of the storage electrode (storage node) formed by the second polysilicon layer, particularly by means of increasing the side wall area.

In producing a trenched type memory cell, perpendicular trenches, which are filled with polysilicon, are formed in a substrate, and an MOS capacitor is formed between the substrate and the polysilicon layer. Since the MOS capacitor is formed on the inner wall surfaces of the trenches, the electrode area can be increased without increasing the area of the memory cell.

However, the stacked type memory cell involves a problem that the aspect ratio of the storage electrode increases as the size of the memory cell is reduced to form steps on the surface of the memory cell. Such steps formed on the surface of the memory cell not only make it difficult to uniformly form a wiring layer thereon but also are liable to cause disconnection in the wiring layer formed. Meanwhile, in the trenched type memory cell, the pitch between the trenches becomes narrow as the size of the memory cell is reduced to disadvantageously increase the leakage current between the trenches. Therefore, even the stacked or trenched type memory cells have encountered a borderline of up to 16M bit DRAMs.

Under such circumstances, a stacked trenched combined type memory cell which is a combination of the stacked type memory cell and the trenched type memory cell was proposed as disclosed in Japanese Unexamined Patent Publication No. 116160/1990 with a view to producing a capacity of 64M bits or more. However, in such stacked-trenched combined type memory cell, a storage electrode of polysilicon layer having a predetermined thickness is formed along the inner wall surface of the trenches. Then a dielectric layer and an opposite electrode are formed successively thereon. Accordingly, the internal surface area of the storage electrode becomes smaller as the size of the memory cell is reduced to disadvantageously reduce capacitance during the steps of successive formation of the dielectric layer and the opposite electrode.

With a view to solving the above problem, a stacked-trenched combined type memory cell as disclosed in Japanese Unexamined Patent Publication No. 3-190162 (hereinafter referred to as improved stacked-trenched combined type memory cell) was proposed. The outline of the process for producing a stacked-trenched combined type memory cell will now be described with reference to FIGS. 13 through 20.

Figure 13:
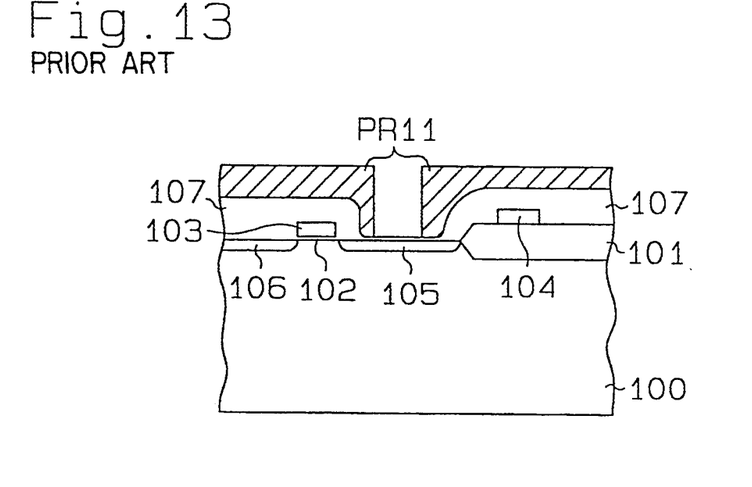
FIGS. 13 to 20 show stepwise in cross sectional views the process for producing a semiconductor device according to a prior art method.

Referring now to FIG. 13 there is shown a process of forming an MOS transistor and a first photoresist pattern PR11 on a P-type semiconductor substrate 100. A field oxide layer 101 is first formed on the semiconductor substrate 100 to define an active region on which a gate oxide layer 102 is then formed. Subsequently, an impurity-doped polysilicon gate electrode (word line) 103 is further formed on the gate oxide layer 102. A word line 104 is formed on the field oxide layer 101 at a position adjacent to the gate electrode 103. The word line 104 is formed using an impurity-doped polysilicon similar to gate electrode 103. An N-type impurity is injected in the surface of the semiconductor substrate on each side of the gate electrode 103 to provide a source region 105 and a drain region 106. A first insulating layer 107 is formed over the entire surface of the resulting structure. Then first photoresist pattern PR11 is formed on insulating layer 107.

The first photoresist pattern PR11 thus formed is subsequently used as an etching mask to carry out etching of predetermined portions of the first insulating layer 107 formed on the source region 105 to expose partly the source region 105.

Figure 14:
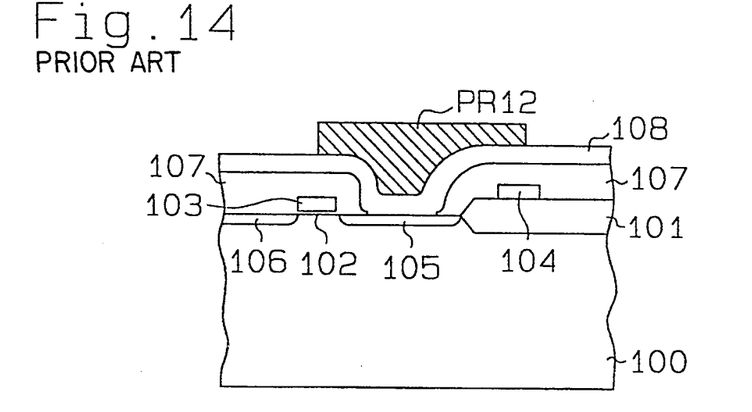

Referring now to FIG. 14 there is shown a process of forming a polysilicon layer 108 to be used as the storage electrode of the MOS capacitor and a second photoresist pattern PR12 as an etching mask for forming the storage electrode. The first photoresist pattern PR11 shown in FIG. 13 is first removed, and a polysilicon layer 108 is formed over the first insulating layer 107 and the exposed portion of the source region 105. Subsequently, a second photoresist pattern PR12 is formed on the polysilicon layer 108.

Figure 15:
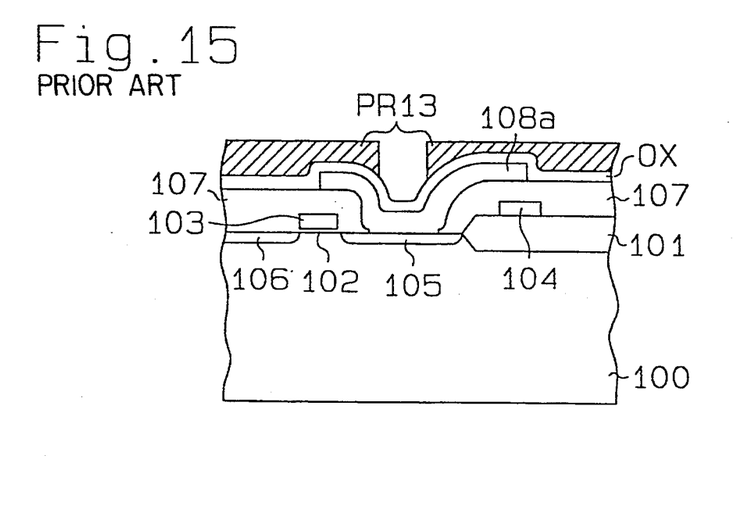

Referring now to FIG. 15 there is shown a process of forming a storage electrode pattern 108a, a second insulating layer OX and a third photoresist pattern PR13. The polysilicon layer 108 is first etched using the second photoresist pattern PR12 (shown in FIG. 14) as an etching mask to form a storage electrode pattern 108a, and then the second photoresist pattern PR12 is removed. Next, a low temperature oxide (LTO) layer or a high temperature oxide (HTO) layer is formed as a second insulating layer OX such that it covers the storage electrode pattern 108a. The third photoresist pattern PR13 is formed on the second insulating layer OX.

Figure 16:
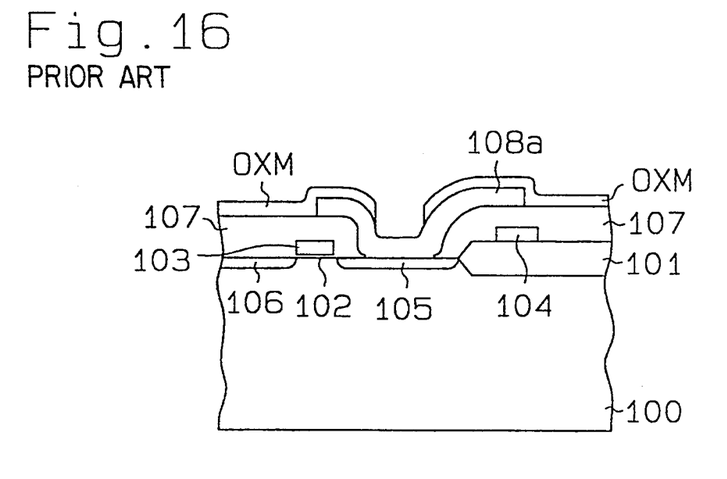

Referring now to FIG. 16 there is shown a process of forming a mask OXM as an etching mask for forming trenches. The second insulating layer OX is first etched using the third photoresist pattern PR13 (shown in FIG. 15) as an etching mask to form a mask OXM. The third photoresist pattern PR13 is then removed.

Figure 17:
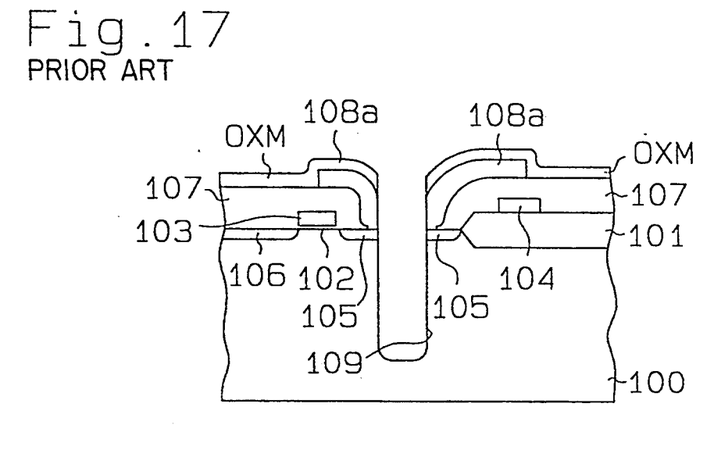

Referring now to FIG. 17 there is shown a process of forming a trench 109. The storage electrode pattern 108a, source region 105 and semiconductor substrate 100 are etched using the mask OXM as an etching mask to form a trench 109.

Figure 18:
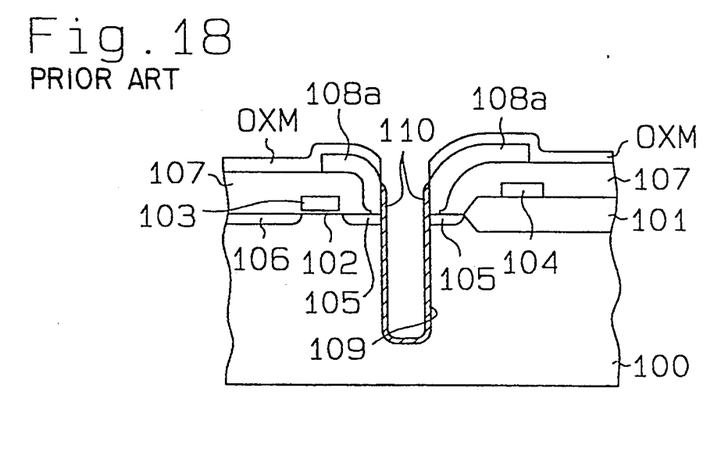

Referring now to FIG. 18 there is shown a process of forming a sacrificial oxide layer 110, which can be formed along the inner surface of the storage electrode pattern 108a and that of the trench 109 by thermal oxidation using the mask OXM as a seed.

Subsequently, the sacrificial oxide layer 110 is removed by BOE (buffered oxide etching), whereby not only the sharp corner at the bottom of the trench 109 can be rounded but also any irregularity such as the portion of the inner wall surface of the trench 109 damaged during formation thereof can be removed.

Figure 19:
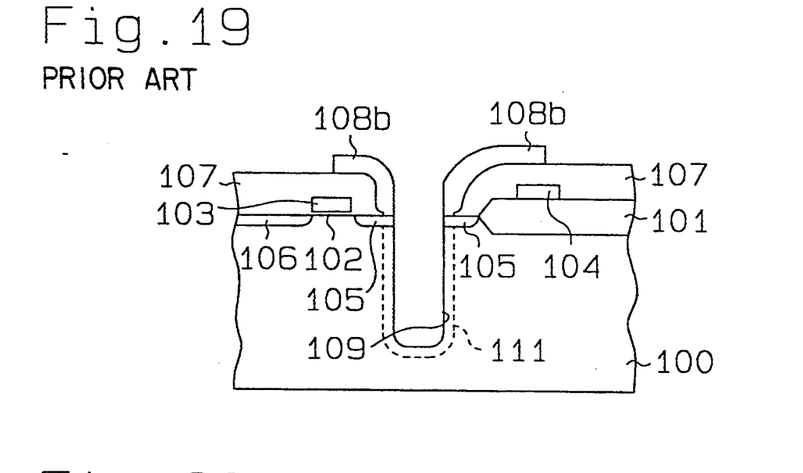

Referring now to FIG. 19 there is shown a process of impurity doping. A polysilicon layer 108b and an impurity doped region 111 can be formed by doping the storage electrode pattern 108a and the inner wall surface of the trench 109 with an N-type impurity. The polysilicon layer 108b and the impurity doping region 111 are used as the storage electrode of the MOS capacitor.

Figure 20:
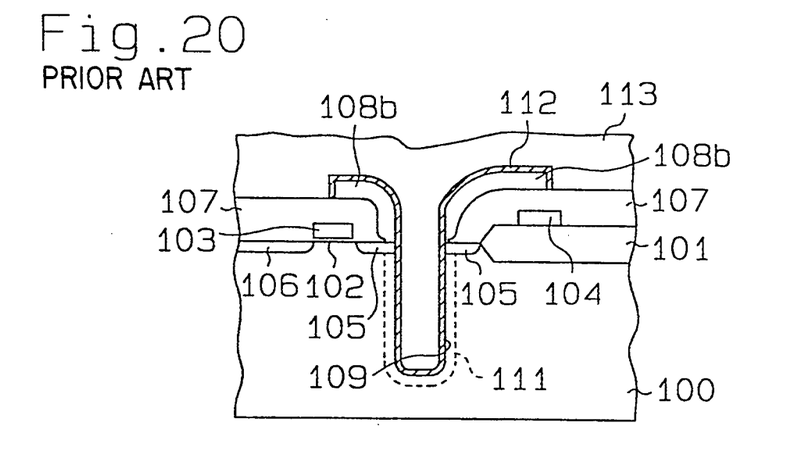

Referring now to FIG. 20 there is shown a process of forming a dielectric layer 112 and an opposite electrode 113. A dielectric layer 112 having an oxide/nitride/oxide structure, a so-called ONO structure, is first formed on the inner wall surface of the trench 109 including the surfaces of polysilicon layer 108b and the impurity doped region 111. Then, a polysilicon layer is further formed as an opposite electrode 113 on the first insulating layer 107 and the dielectric layer 112 so as to fill up the trench 109.

Thus, in such improved stacked-trenched combined type memory cell, the polysilicon layer 108b and the impurity doped region 111 are utilized as the storage electrode of the MOS capacitor. Accordingly, a large storage electrode area can be achieved, compared with the process for forming a storage electrode using a polysilicon layer having a predetermined thickness along the inner wall surface of the trench (as disclosed in Japanese Unexamined Patent Publication No. 116160/1990), to provide greater capacitance.

However, the process for producing the improved stacked-trenched combined type memory cells is complicated and thus costly. The trench 109 cannot be formed without going through the step of forming a third photoresist pattern PR13 as shown in FIG. 15, a step of forming a mask OXM as shown in FIG. 16 and the step of subjecting the storage electrode pattern 108a, the source region 105 and the semiconductor substrate 100 to anisotropic etching as shown in FIG. 17. Thus, in order to form a trench 109 accurately in position, the anisotropic etching of the second insulating layer OX must be accurately controlled after the profile of the photoresist pattern PR13 is accurately controlled. The anisotropic etching of the storage electrode pattern 108a, source region 105 and the semiconductor substrate 100 must also be controlled accurately. However, it is difficult to achieve such controls accurately, and there occurs a problem that the trench 109 is liable to be formed out of position. This can cause fatal defects especially in the conventional improved stacked-trenched combined type memory cell as the memory cell has less capacitance.

This invention is proposed in order to solve the above problems, and it is an object of the invention to provide a simple process for producing an improved stacked-trenched combined type memory cell. It is another object of the invention to provide a process for producing an improved stacked-trenched combined type memory cell in which the trench can be efficiently formed.

SUMMARY OF THE INVENTION

In order to attain the intended objects, the process for producing a semiconductor device according to this invention comprises the following steps 1 to 9. In step 1, a field oxide layer is formed on a first conductivity type semiconductor substrate to define an active region. In step 2, gate electrodes, second conductivity type source regions and drain regions are formed on the active region, whereas word lines are formed on the field oxide layer, and an insulating layer is then formed over the substrate obtained in step 1. In step 3, contact holes are formed through the insulating layer so as to partly expose the source regions obtained in step 2. In step 4, a polysilicon layer is formed over the exposed source region and the entire surface of the insulating layer. In step 5, a pattern to serve as a mask is formed on the polysilicon layer. In the step 6, the polysilicon layer is etched under conditions where selectivity to the insulating layer is high using the photoresist pattern thus formed as an etching mask to form a storage electrode pattern, as well as, to form trenches simultaneously in the semiconductor substrate at the source regions. In step 7, the semiconductor substrate is doped along the storage electrode pattern and the inner surfaces of the trenches with a second conductivity type impurity. In step 8, a dielectric layer is formed on the doped storage electrode pattern and the doped inner wall surfaces of the trenches. Finally in step 9, an opposite electrode is formed on the dielectric layer.

BRIEF DESCRIPTION OF THE DRAWINGS

The features of this invention that are believed to be novel are set forth with particularity in the appended claims. The invention, together with the objects and advantages thereof, may be better understood by reference to the following description of the preferred embodiments taken in conjunction with the accompanying drawings in which:

DESCRIPTION OF THE PREFERRED EMBODIMENT

One embodiment of the invention will be described below referring to the cross-sectional views shown in FIGS. 1 to 11.

Figure 1:
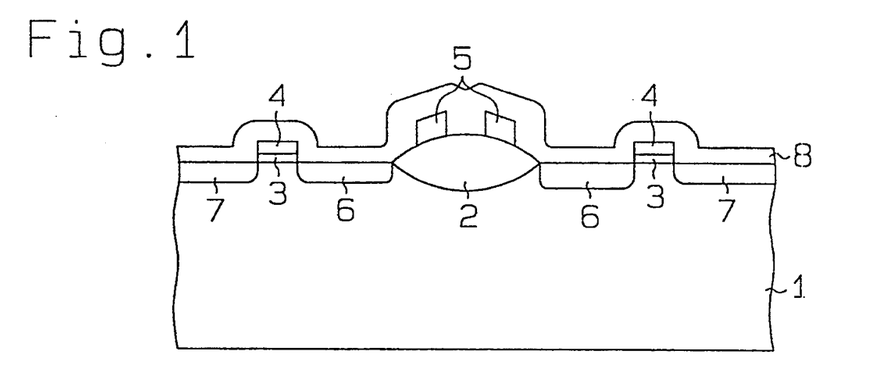
FIGS. 1 to 11 show stepwise in cross sectional views the process for producing a semiconductor device according to one embodiment of the invention.

Referring now to FIG. 1 there is shown a process of forming an MOS transistor on a P-type semiconductor substrate 1. First, a field oxide layer 2 is formed on the semiconductor substrate 1 by a LOCOS (local oxidation of silicon) method to define an active region. A gate oxide layer 3 having a film thickness of about 50 to 200 Å is formed on the active region. Subsequently, impurity-doped polysilicon gate electrodes (word line) 4 are further formed on the gate oxide layer 3. Simultaneously, word lines 5 are formed on the field oxide layer 2 at positions adjacent to the gate electrode 4. The word lines 5 are formed using an impurity-doped polysilicon like in the case of the gate electrodes 4. The surface of the semiconductor substrate 1 is doped with an N-type impurity on each side of each gate electrode 4 to provide source (or drain) regions 6 and drain (or source) regions 7, and then a silicon oxide layer is formed as an insulating layer 8 over the entire surface of the resulting structure.

Figure 2:
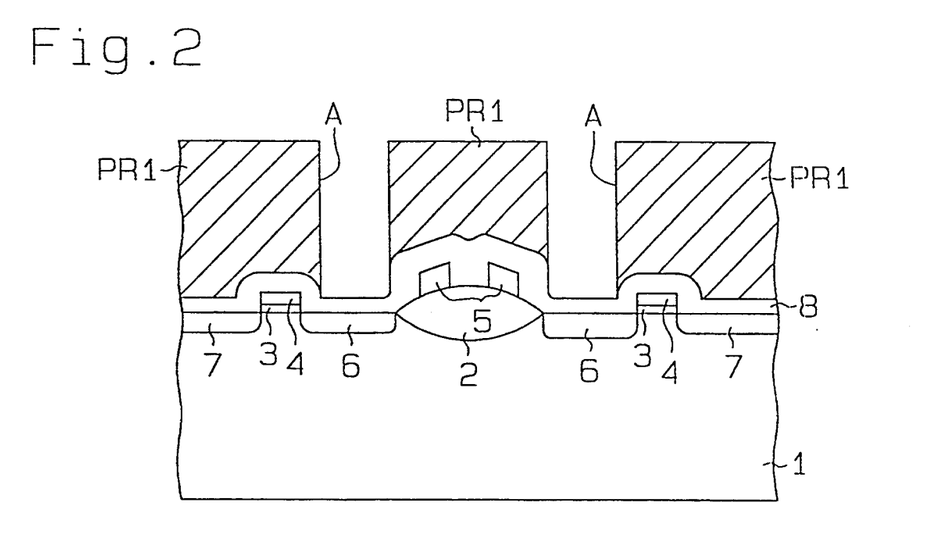

Referring now to FIG. 2 there is shown a process of forming a first photoresist pattern PR1 on the insulating layer 8. A first photoresist pattern PR1 having openings A for exposing parts of the source regions 6 can be formed through a step of photoresist application onto the insulating layer 8, a step of light exposure through a mask, a step of development, etc.

Figure 3:
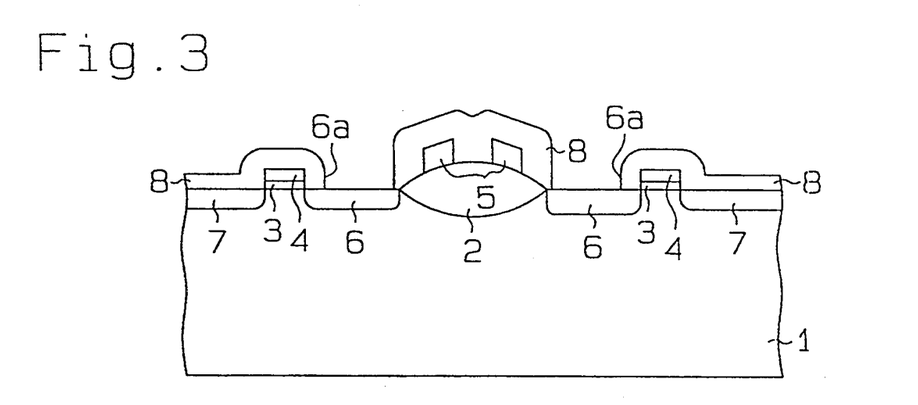

Referring now to FIG. 3 there is shown a process of forming contact holes 6a by partially exposing the source regions 6. The first photoresist pattern PR1 (See FIG. 2) is used as an etching mask to carry out anisotropic etching of the insulating layer 8 present on the source regions 6 to form contact holes 6a for partially exposing the source region 6. The diameter of the contact holes 6a thus formed corresponds to that of the openings A of the first photoresist pattern PR1. The first photoresist pattern PR1 is then removed by conventional method.

Figure 4:
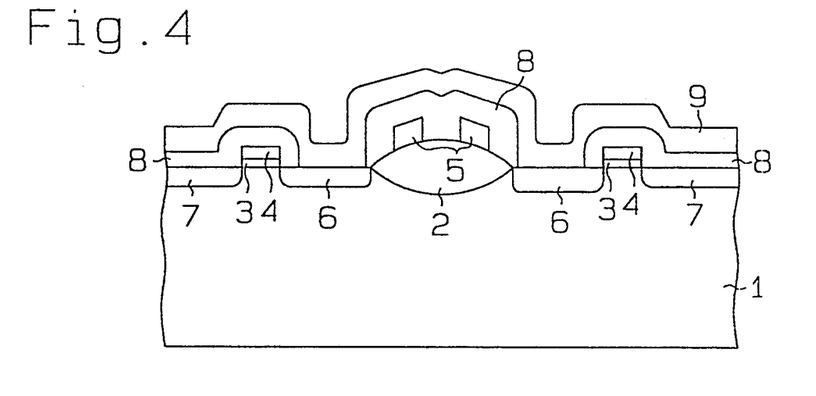

Referring now to FIG. 4 there is shown a process of forming a polysilicon layer 9 to be used as the storage electrode of the MOS capacitor. A polysilicon layer 9 having a film thickness of about 0.3 $\mu$m is formed over the exposed portions of the source regions 6 within the contact holes 6a and over the insulating layer 8.

Figure 5:
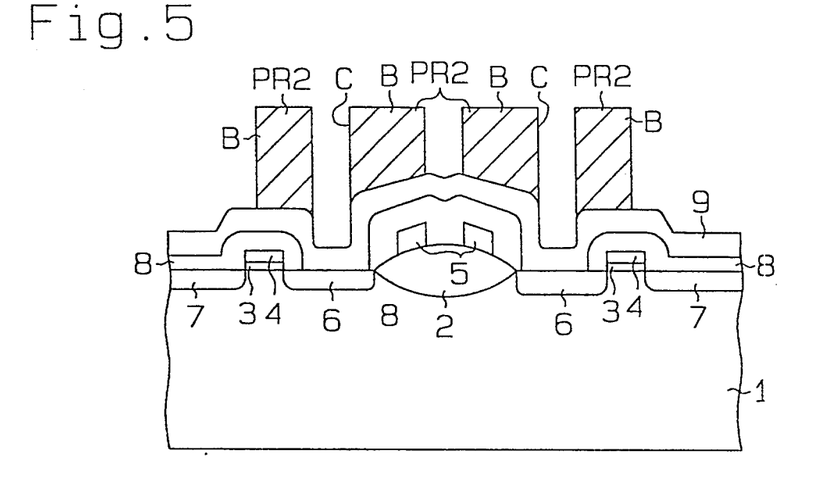

Referring now to FIG. 5 there is shown a process of forming a second photoresist pattern PR2 to be used as an etching mask for forming storage electrodes and trenches. The second photoresist pattern PR2 can be formed through a step of applying photoresist onto the polysilicon layer 9, a step of light irradiation through a mask, a step of development, etc. Thus, regions B where storage electrodes are to be formed and openings C for forming trenches are formed on the second photoresist pattern PR2. The openings C are disposed in the regions B and each have a diameter smaller than that of the opening A of the first photoresist pattern PR1.

Figure 12:
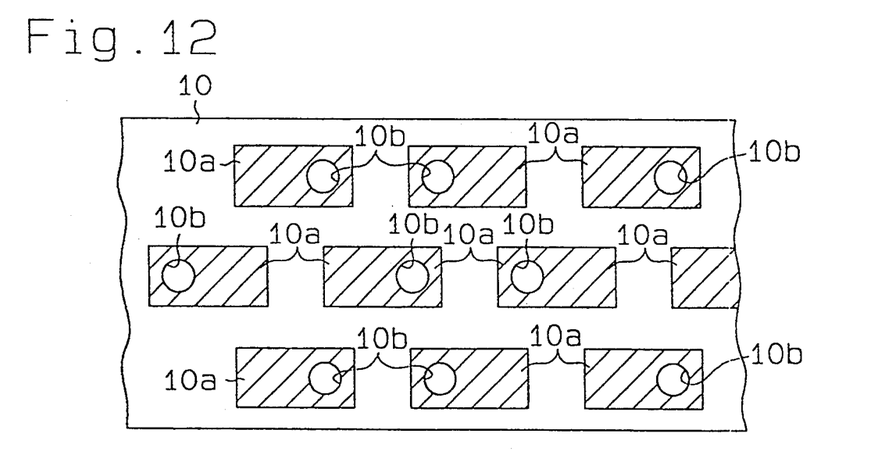
FIG. 12 shows partly in plan view a photomask 10 to be employed in the process for producing a semiconductor device according to a preferred embodiment of the invention.

Referring now to FIG. 12 there is shown partially in plan view a photomask 10 which is used for forming the second photoresist pattern PR2. If the photoresist to be used for forming the second photoresist pattern PR2 is of a positive type, the photomask 10 has light shield regions 10a which correspond to the regions B of the second photoresist pattern PR2 and circular light transmission regions 10b which correspond to the openings C.

Figure 6:
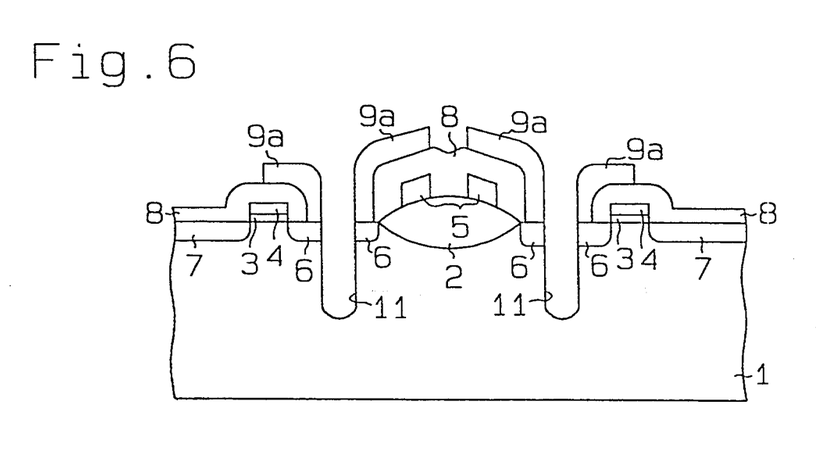

Referring now to FIG. 6 there is shown a process for forming a storage electrode pattern 9a and trenches 11. The polysilicon layer 9 is anisotropically etched using the second photoresist pattern PR2 shown in FIG. 5 as an etching mask to form a storage electrode pattern 9a. Simultaneously the polysilicon layer 9, the source regions 6 and the semiconductor substrate 1 are anisotropically etched to form trenches 11. The etching conditions used here shall have high selectivity to the insulating layer 8, so that the insulating layer 8 shall be protected against etching. For example, if a silicon oxide film is used as the insulating layer 8, the polysilicon layer 9 has a film thickness of about 0.3 $\mu$m, and the trenches 11 each have a depth of 1 $\mu$m as measured from the surface of the semiconductor substrate 1. The etching treatment is carried out using an ECR (electron cyclotron resonance) etching apparatus under the following conditions:

Gas: HBr (or Cl₂ or a mixed gas of HBr and Cl₂)
  Gas pressure: 5 mTorr
  Microwave: 1 KW
  Radio frequency power: 60 W
  O₂ flow rate: 4 sccm After etching is completed, the second photoresist pattern PR2 is removed.

Figure 7:
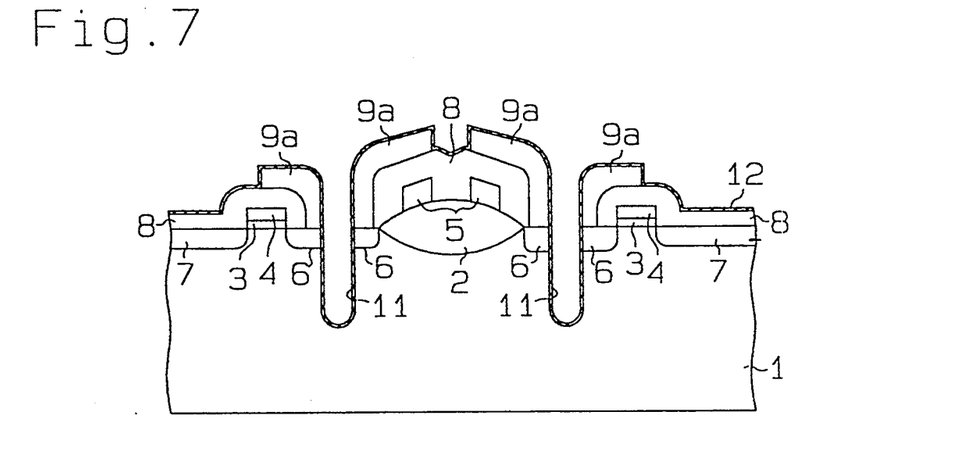

Referring now to FIG. 7 there is shown a process for forming a sacrificial oxide layer 12, which can be formed by subjecting the entire surface of the structure including the outer surfaces of the storage electrode pattern 9a and the inner surfaces of the trenches 11 to thermal oxidation. Subsequently, the sacrificial oxide layer 12 is removed by BOE, whereby not only the sharp corners at the bottom of the trenches 11 can be rounded but also any irregularity such as the layers of the inner wall surfaces of the trenches 11 damaged during formation thereof can be removed.

Figure 8:
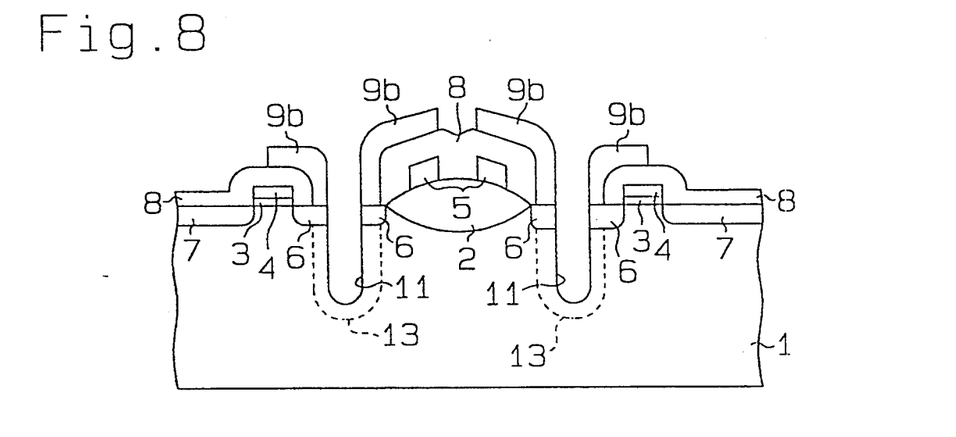

Referring now to FIG. 8 there is shown a process of impurity doping. A polysilicon layer 9b and impurity doped regions 13 can be formed by doping the storage electrode pattern 9a and the inner wall surfaces of the trenches 11 (see FIG. 7) with an N-type impurity. As described above, the diameter of each contact hole 6a (see FIG. 3) corresponds to that of the opening A (see FIG. 2) of the first photoresist pattern PR1; whereas the diameter of each trench corresponds to that of the opening C (see FIG. 5) of the second photoresist pattern PR2. Since the diameter of the opening C is smaller than that of the opening A, the diameter of the trench 11 becomes smaller than that of the contact hole 6a, and thus the polysilicon layer 9b and the impurity doping regions 13 are directly connected through the N-type source regions 6. The polysilicon layer 9b and the impurity doping regions 13 are used as the storage electrode of the MOS capacitor.

Figure 9:
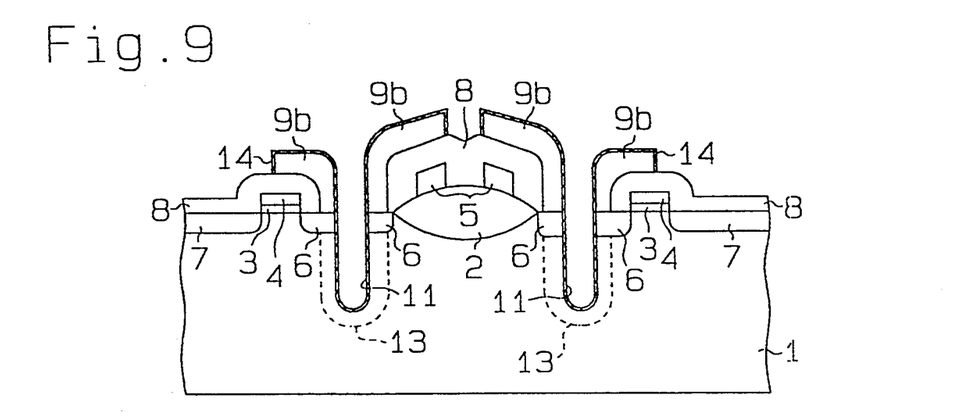

Referring now to FIG. 9 there is shown a process of forming a dielectric layer 14. An LTO film or an HTO film having a thickness of about 10 to 60 Å is first formed as a lower oxide layer on the inner wall surface of the trenches 11 including the surface of the polysilicon layer 9b, and the impurity doped regions 13. A nitride layer having a film thickness of about 50 to 150 Å is then formed on the lower oxide layer by LP (low pressure) CVD in an ammonia atmosphere. Subsequently, an upper oxide layer having a film thickness of about 10 to 60 Å is formed on the nitride layer in the same manner as used for forming the lower oxide layer. Thus, a dielectric layer 14 having an ONO structure can be formed. The LTO or HTO film used as the lower oxide layer of the dielectric layer 14 enables formation of a uniform lower oxide layer irrespective of the degree of doping the substrate or the kind of impurity. Further, the characteristics of the dielectric layer 14 can be improved by allowing the nitride film in the dielectric layer 14 to have a multi-layered structure.

Figure 10:
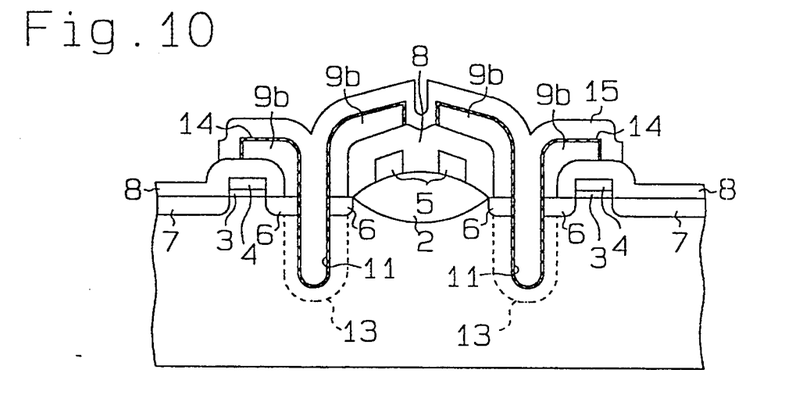

Referring now to FIG. 10 there is shown a process of forming an opposite electrode 15 on the dielectric layer 14. A polysilicon layer is formed on the insulating layer 8 and the dielectric layer 14 to fill up the trenches 11 therewith. The portions of the polysilicon layer on the insulating layer 8 are removed, while the portions of the polysilicon layer in the trenches 11 and on the dielectric layer 14 are left to form opposite electrodes 15.

Figure 11:
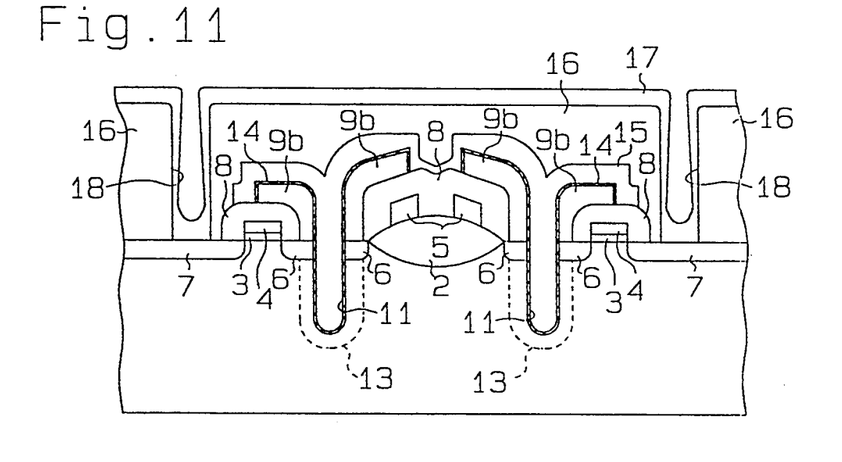

Referring now to FIG. 11 there is shown a process of forming an insulating layer 16 and a bit line 17 on the insulating layer 8 and the opposite electrodes 15. An insulating layer 16 is first formed over the insulating layer 8 and the opposite electrodes 15, and then contact holes 18 are formed at the positions corresponding to the drain regions 7 of the insulating layer 16. Subsequently, a metal wiring layer, such as for instance aluminum, for forming a bit line 17 is formed on the insulating layer 16 by sputtering to allow the bit line 17 to be connected with the drain regions 7 through the contact holes 18. Thus, the process of producing an improved stacked-trenched combined type memory cell according to a preferred embodiment of the invention is completed.

Still referring to FIG. 11 the improved stacked-trenched combined type memory cell produced according to the above-described preferred embodiment of the invention is provided with a field oxide layer 2 for defining an active region on a first conductivity type semiconductor substrate 1. Gate electrodes (word lines) 4 are formed on the active region through the gate oxide layer 3. Second conductive type source regions 6 and drain regions 7 are formed on the semiconductor substrate 1 on each side of each gate electrode 4. Further, word lines 5 are formed on the field oxide layer 2 at positions adjacent to the gate electrode 4. Trenches 11 are formed in the source regions 6 of the semiconductor substrate 1. The second conductivity type impurity doped regions 13 are provided on the inner surface of the trenches 11 so as to be connected to the source regions 6. An insulating layer 8 is formed on the gate electrodes 4 and word lines 5, and further a polysilicon layer 9b doped with a second conductivity type impurity is formed on the insulating layer 8 so as to be connected to the impurity doped regions 13 through the source regions 6. The impurity doping regions 13 provided on the inner surfaces of the trenches 11 and the polysilicon layer 9b constitute the storage electrode of the MOS capacitor. A dielectric layer 14 is formed on the inner surfaces of the trenches 11, and an opposite electrode 15 is formed on the dielectric layer 14. An insulating layer 16 and a bit line 17 are formed on the insulating layer 8 and the opposite electrode 15, and contact holes 18 are defined so as to connect the bit line 17 to the drain regions 7.

As described above, the polysilicon layer 9b and the impurity doped regions 13 are used as the storage electrode of the MOS capacitor in this embodiment like in the improved stacked-trenched combined type memory cell (disclosed in Japanese Unexamined Patent Publication No. 3-190162). Accordingly, a large area of storage electrode can be secured compared with the method in which the storage electrode is formed by a predetermined thickness of polysilicon layer on the inner surfaces of the trenches (as disclosed in Japanese Unexamined Patent Publication No. 2-116160), thus providing greater capacitor volume.

For example, when trenches 11 each having a depth of about 1 μm as measured from the surface of the semiconductor substrate 1 is to be formed using a photomask 10 shown in FIG. 12 having the light shield regions 10a with dimensions of 1×2 μm, the light transmission regions 10b with a diameter of 0.5 μm and a polysilicon layer 9 with a film thickness of about 0.3 μm, the surface area of the storage electrode amounts to about 5.6 μm². Meanwhile, if a different type of photomask, in which the light transmission regions 10b are omitted from the photomask 10 shown in FIG. 12 is used, a stacked type memory cell can be produced. In the latter case, the surface area of the storage electrode becomes 3.8 μm² provided that the dimensions of the light shield region and the film thickness of the polysilicon layer 9 are the same as used in the above embodiment. Therefore, the electrode area of the former embodiment that is, the MOS capacitor constructed according to the teachings of the invention, can be increased about 1.5 times as much as that of the stacked type memory cell.

In the above MOS capacitor, constructed according to the teachings of the invention the storage electrode pattern 9a and trenches 11 are formed simultaneously by means of anisotropic etching using the second photoresist pattern PR2 as an etching mask. Meanwhile, in the prior art improved stacked-trenched combined type memory cell, after the storage electrode pattern 108a is formed using the second photoresist pattern PR12 as the etching mask, the trench 109 is formed by etching using the mask OXM as an etching mask. While the storage electrode pattern 108a and trench 109 are formed independently by different etching steps in the prior art, they are formed in one etching step in the embodiment of the invention. Accordingly, semiconductor devices can be produced by a simple process and at low production cost according to the teachings of the invention compared with the prior art method.

Further, the prior art method suffers a problem that the trench 109 is liable to be formed out of position, as explained earlier. However, in the embodiment constructed according to the teachings of the invention, trenches 11 can be formed accurately in position merely by accurately controlling the profile of the second photoresist pattern PR2 and by further accurately controlling the anisotropic etching using the second photoresist pattern PR2 as the etching mask. Accordingly, working accuracy of forming trenches can be enhanced in the embodiment of the invention over the prior art process.

The reason the mask OXM is formed in the prior art is to prevent a sacrificial oxide layer 110 from being formed on the surface of the storage electrode pattern 108a during the formation thereof to change the profile of the storage electrode pattern 108 when the sacrificial oxide layer 110 is removed. However, according to the analysis of the present inventors, such change in profile of the storage electrode pattern 108a is very small, so that it can be neglected in the case of 256M bit DRAMs. Accordingly, the sacrificial oxide layer 12 is formed on the surface of the storage electrode pattern 9a according to this embodiment, and the profile of the storage electrode pattern 9a is slightly changed when the sacrifice oxide layer 12 is removed. However, such slight change in the profile does not cause any problem. Meanwhile, the storage electrode pattern 9a is formed taking such change in the profile into consideration. In other words, the desired profile of polysilicon layer 9b can be formed without being affected by the sacrificial oxide layer 12 by designing the dimensions of the light shield regions 10a of the second photoresist pattern PR12 so as to compensate for the probable profile change in the storage electrode pattern 9a.

It should be noted here that the present invention is not limited to the above embodiment, and the following embodiments are further possible without departing from the teachings of the invention.

1) A Group V element such as arsenic, phosphorus and antimony or a compound of a Group V element such as phosphorus oxychloride (POCl₃) may be used as the N type impurity for doping the storage electrode pattern 9a and the inner surfaces of the trenches 11 as well as for forming the source regions 6 and drain regions 7. Referring to the doping method, ion implantation is used for arsenic, phosphorus or antimony doping, whereas in the case of gas doping such as of phosphorus oxychloride, thermal diffusion in such gaseous atmosphere is used.

2) Any insulating films other than silicon oxide film including silicon nitride film and silicate glass can be used for the insulating layer 8. Any methods known in the art including sputtering and CVD (chemical vapor deposition) can be used for forming the insulating layer 8.

3) The anisotropic etching of the insulating layer 8 can be carried out by any method known in the art including wet etching, dry etching and a combination of wet etching and dry etching.

4) The polysilicon layer 9 can be formed by any methods including sputtering and CVD.

5) If the photoresist to be used for forming the second photoresist pattern PR2 is of a negative type, the light shield regions 10a and the light transmission regions 10b shall be inversed from a positive to negative type.

6) An RIE (reactive ion etching) apparatus or a magnetron RIE apparatus may be used instead of the ECR etching apparatus for forming the storage electrode pattern 9a and trenches 11.

7) The dielectric layer 14 may be of ON (oxide/nitride) structure or of NO (nitride/oxide) structure instead of the ONO structure.

8) For the dielectric layer 14, a high dielectric film such as of PZT (PbZr$_{1-x}$Ti$_x$O$_3$), PLZT (Pb$_{1-x}$La$_x$Zr$_{1-y}$Ti$_y$O$_3$), BTO (BATiO$_3$), BST (Ba$_{1-x}$Sr$_x$TiO$_3$), STO (SrTiO$_3$) and Ta$_2$O$_5$ may be used.

9) The steps of forming the sacrifice oxide layer 12 and removing thereof may be omitted, and the removal of the layer along the inner wall surfaces of the trenches 11 damaged during formation thereof can be carried out by any of the following procedures:
  (i) Dry etching using a gas mixture of CF$_4$ and O$_2$ or NF$_3$ alone, and
  (ii) Exposure of the semiconductor substrate to ClF$_3$ atmosphere.

ClF$_3$ is a highly reactive gas and reacts with silicon at room temperature to form fluorides. Namely, ClF$_3$ reacts with the silicon in the damaged layer on the inner wall surfaces of the trenches 11 (Si+2F$_2$→SiF$_4$↑), and thus the damaged layer can be removed.

10) An N type semiconductor substrate 1 may be used. In this case a P type impurity is used for doping. The P type impurity includes boron and indium.

11) The second photoresist pattern PR2 may be replaced with an appropriate different layer, and the storage electrode pattern 9a and trenches 11 can be formed by using the layer as an etching mask.

What is claimed is:

1. A process for producing a semiconductor device, comprising:
   a first step of forming a field oxide layer on a first conductivity type substrate to define an active region;
   a second step of forming gate electrodes, second conductivity type source regions and drain regions on said active region, and simultaneously forming word lines on said field oxide layer, followed by formation of an insulating layer on said substrate;

a third step of forming contact holes through said insulating layer so as to partly expose the source regions;

a fourth step of forming a polysilicon layer on the portions of the source regions exposed in the third step and on the entire surface of said insulating layer;

a fifth step of forming a mask pattern on said polysilicon layer;

a sixth step of simultaneously forming a storage electrode pattern and trenches through said first conductivity type substrate at the source regions by etching said polysilicon layer using said mask pattern as an etching mask;

a seventh step of doping the storage electrode pattern and the inner wall surfaces of said trenches with a second conductivity type impurity;

an eighth step of forming a dielectric layer on said impurity-doped storage electrode pattern and doped inner wall surfaces of said trenches; and a ninth step of forming an opposite electrode on said dielectric layer.

2. The process according to claim 1, wherein said field oxide layer in the first step is formed by means of LOCOS.

3. The process according to claim 1, wherein said insulating layer in the second step is formed using a material selected from the group consisting of a silicon oxide film, a silicon nitride film and silicate glass.

4. The process according to claim 1, wherein said insulating layer in the second step is formed by means of sputtering or CVD.

5. The process according to claim 1, wherein said contact holes in the third step are formed by at least one of dry etching, wet etching and a combination of wet etching and dry etching.

6. The process according to claim 1, wherein said polysilicon layer of the fourth step is formed by means of sputtering or CVD.

7. The process according to claim 1, wherein said pattern of the fifth step has regions for forming storage electrodes and openings for forming trenches; the openings located within said storage electrode forming regions and each having a diameter smaller than that of said contact holes of the third step.

8. The process according to claim 1, wherein said etching in the sixth step is carried out under etching conditions where selectivity to the insulating layer is high by at least one of wet etching, dry etching and a combination of wet etching and dry etching.

9. The process according to claim 8, wherein said dry etching includes at least one of ECR etching, RIE and magnetron RIE.

10. The process according to claim 1, wherein the sixth step includes after formation of said trenches an additional step of rounding the sharp corners at the bottoms of said trenches and removing the layer along the inner wall surfaces of the trenches damaged during formation of said trenches.

11. The process according to claim 10, wherein said additional step is carried out by any of:

a method where a sacrificial oxide layer is formed along inner wall surfaces of the trenches and then said sacrificial oxide layer is removed;

a dry etching method using $CF_4O_2$ or $NF_3$; or a method where said semiconductor substrate is exposed to a $ClF_3$ atmosphere.

12. The process according to claim 1, wherein said impurity used for doping in the seventh step is a material selected from the group consisting of arsenic, phosphorus, antimony, phosphorus oxychloride, boron, and indium.

13. The process according to claim 1, wherein said impurity doping in the seventh step is carried out by means of thermal diffusion or ion implantation.

14. The process according to claim 1, wherein said dielectric layer of the eighth step is one of oxide/nitride/oxide (ONO) structure, nitride/oxide (NO) structure or oxide/nitride (ON) structure, and a highly dielectric film.

15. The process according to claim 14, wherein the lower oxide layer of said dielectric layer having said ONO or ON structure is either an HTO film or LTO film.

16. A process for producing a semiconductor device, comprising:

a first step of forming a field oxide layer by means of LOCUS on a first conductivity type semiconductor substrate to define an active region;

a second step of forming gate electrodes, second conductivity type source regions and drain regions on said active region, as well as, forming word lines on said field oxide layer, followed by formation of an insulating layer on said semiconductor substrate using a material selected from the group consisting of a silicon oxide film, a silicon nitride film and silicate glass by means of sputtering or CVD;

a third step of forming contact holes through said insulating layer so as to partly expose the source regions by at least one of dry etching, wet etching and a combination of dry etching and wet etching;

a fourth step of forming a polysilicon layer on the portions of the source regions exposed in the third step and the entire surface of said insulating layer by means of sputtering or CVD;

a fifth step of forming a mask pattern having regions for forming storage electrodes and openings for forming trenches on said polysilicon layer, the openings locating within said storage electrode forming regions and each having a diameter smaller than that of said contact holes of the third step;

a sixth step of simultaneously forming a storage electrode pattern and trenches through said semiconductor substrate at the source regions by etching said polysilicon layer, under conditions where selectivity to said insulating layer is high, using said mask pattern as an etching mask by means of wet etching, dry etching or a combination of wet etching and dry etching including at least one of ECR etching, RIE and magnetron RIE followed by rounding of the sharp corners at the bottoms of said trenches and removal of the layers along the inner wall surfaces of said trenches damaged during formation of said trenches by any of: a method where a sacrificial oxide layer is formed along the inner wall surfaces of said trenches and then removed, a dry etching method using a gas, or a method where said semiconductor substrate is exposed to a $ClF_3$ atmosphere;

a seventh step of doping the storage electrode pattern and the inner wall surfaces of said trenches with a second conductivity type impurity selected from the group consisting of arsenic, phosphorus, antimony, phosphorus oxychloride, boron and indium by means of thermal diffusion or ion implantation;

an eighth step of forming a dielectric layer having at least one of an oxide/nitride/oxide (ONO) structure, nitride/oxide (NO) structure or oxide/nitride (ON) structure, and a highly dielectric layer on said doped storage electrode pattern and doped inner wall surfaces of said trenches; and a ninth step of forming an opposite electrode on said dielectric layer.

* * * * *